United States Patent
Ryu et al.

(10) Patent No.: US 9,905,288 B2
(45) Date of Patent: Feb. 27, 2018

(54) SEMICONDUCTOR MEMORY DEVICES AND METHODS OF OPERATING THE SAME

(71) Applicant: SAMSUNG ELECTRONICS CO., LTD., Suwon-si, Gyeonggi-do (KR)

(72) Inventors: Seung-Woo Ryu, Seoul (KR); Sang-Kyu Kang, Anyang-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/435,383

(22) Filed: Feb. 17, 2017

(65) Prior Publication Data
US 2017/0287546 A1  Oct. 5, 2017

(30) Foreign Application Priority Data

Mar. 29, 2016 (KR) .................. 10-2016-0037322

(51) Int. Cl.
| | |
|---|---|
| *G11C 8/00* | (2006.01) |
| *G11C 11/4096* | (2006.01) |
| *G11C 11/4076* | (2006.01) |
| *G11C 8/18* | (2006.01) |
| *G06F 1/12* | (2006.01) |
| *G06F 1/08* | (2006.01) |

(52) U.S. Cl.
CPC ............ *G11C 11/4096* (2013.01); *G06F 1/08* (2013.01); *G06F 1/12* (2013.01); *G11C 8/18* (2013.01); *G11C 11/4076* (2013.01)

(58) Field of Classification Search
CPC ......... G11C 11/4096; G11C 8/18; G06F 1/08; G06F 1/12

USPC ............................. 365/233.1, 233.12, 233.19
See application file for complete search history.

(56) References Cited

U.S. PATENT DOCUMENTS

| | | | |
|---|---|---|---|
| 6,313,669 B1 * | 11/2001 | Suenaga | H03K 19/01858 |
| | | | 226/16 |
| 6,724,686 B2 | 4/2004 | Ooishi et al. | |
| 7,269,699 B2 | 9/2007 | Jang | |
| 7,804,734 B2 | 9/2010 | Koo et al. | |
| 7,940,066 B2 | 5/2011 | Jarboe, Jr. et al. | |
| 7,969,799 B2 | 6/2011 | Butt et al. | |
| 8,023,342 B2 | 9/2011 | Venkataraman et al. | |
| 8,432,185 B2 | 4/2013 | Scott et al. | |
| 8,799,730 B2 | 8/2014 | Oh et al. | |
| 8,897,083 B1 | 11/2014 | Azizi et al. | |
| 9,043,633 B2 | 5/2015 | Ware et al. | |
| 2002/0017926 A1 * | 2/2002 | Saito | G01R 23/15 |
| | | | 327/39 |

* cited by examiner

*Primary Examiner* — Vu Le

(74) *Attorney, Agent, or Firm* — Volentine & Whitt, PLLC

(57) ABSTRACT

A semiconductor memory device includes a memory cell array and a control logic circuit. The control logic circuit controls access to the memory cell array based on a command and an address. The semiconductor memory device performs a write operation to write data in the memory cell array and performs a read operation to read data from the memory cell array in synchronization with a clock signal from an external memory controller. The semiconductor memory device performs the write operation and the read operation in different data strobe modes in which the semiconductor memory device uses different numbers of data strobe signals according to a frequency of the clock signal.

20 Claims, 15 Drawing Sheets

SEMICONDUCTOR MEMORY DEVICES AND METHODS OF OPERATING THE SAME

CROSS-REFERENCE TO RELATED APPLICATION(S)

This application claims priority under 35 U.S.C. § 119 to Korean Patent Application No. 10-2016-0037322, filed on Mar. 29, 2016 in the Korean Intellectual Property Office, the disclosure of which is incorporated by reference herein in its entirety.

BACKGROUND

1. Technical Field

The present disclosure relates to memory devices. More particularly, the present disclosure relates to semiconductor memory devices and methods of operating the same.

2. Background Information

In general, a semiconductor memory device such as a double data rate synchronous dynamic random access memory (DDR SDRAM) includes tens of millions of memory cells, and stores and outputs data in response to a command requested from a chipset. That is, if the chipset requests a write operation to the semiconductor memory device, the semiconductor memory device stores data on a memory cell corresponding to an address inputted from the chipset. If the chipset requests a read operation to/from the semiconductor memory device, the semiconductor memory device outputs the data stored on the memory, cell corresponding to the address inputted from the chipset.

The synchronous semiconductor memory device inputs/outputs data in synchronization with a clock signal. An amount of data may tend to increase over time. Power consumption of the synchronous semiconductor memory device increases as the amount of data increases.

SUMMARY

Some exemplary embodiments provide a semiconductor memory device, capable of reducing current consumption without increasing occupied area.

Some exemplary embodiments provide a memory system that includes the semiconductor memory device.

According to exemplary embodiments, a semiconductor memory device includes a memory cell array and a control logic circuit. The control logic circuit controls access to the memory cell array based on a command and an address. The semiconductor memory device performs a write operation to write data in the memory cell array and performs a read operation to read data from the memory cell array in synchronization with a clock signal from an external memory controller. The semiconductor memory device performs the write operation and the read operation in different data strobe modes in which the semiconductor memory device uses different numbers of data strobe signals according to a frequency of the clock signal.

According to exemplary embodiments, in a method of operating a semiconductor memory device that includes a memory cell array, it is determined whether a frequency of a clock signal is smaller than or equal to a reference frequency. The clock signal is provided from an external memory controller. A memory operation is performed on the memory cell array using a number of data strobe signals that varies according to the frequency of the clock signal.

Accordingly, in a semiconductor memory device and a method of operating a semiconductor memory device, power consumption may be reduced by reducing a second number of data strobe signals used when the frequency of the clock signal is smaller than or equal to the reference frequency, compared to a first number of data strobe signals used when the frequency of the clock signal is greater than the reference frequency.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Various exemplary embodiments will be described more fully hereinafter with reference to the accompanying drawings, in which some exemplary embodiments are shown.

Figure 1:
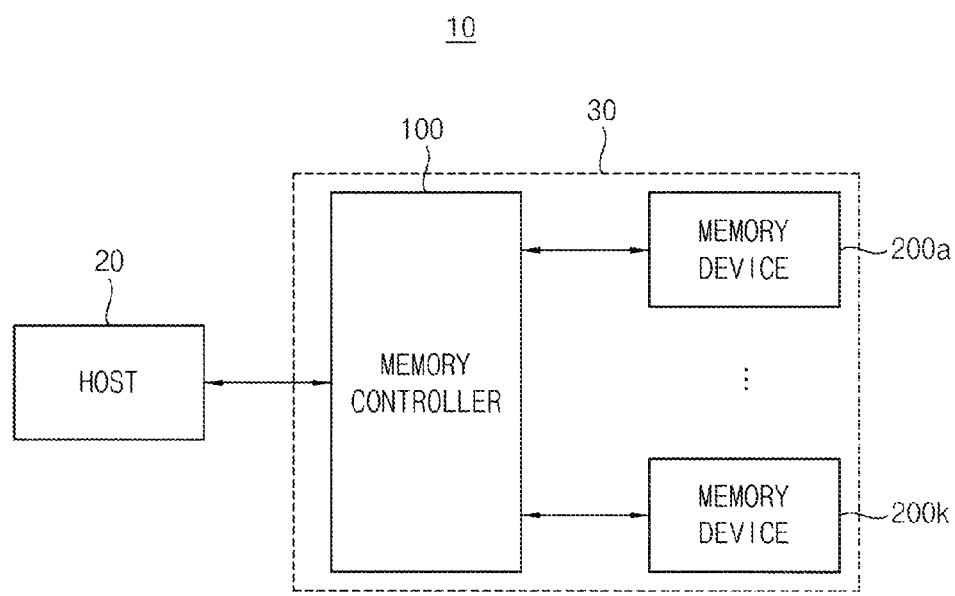
FIG. 1 is a block diagram illustrating an electronic memory system according to exemplary embodiments.

FIG. 1 is a block diagram illustrating an electronic memory system according to exemplary embodiments.

Referring to FIG. 1, an electronic system 10 may include a host 20 and a memory system 30. The memory system 30 may include a memory controller 100 and multiple semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the semiconductor memory devices 200a~200k. For example, the memory controller 100 may write data in the semiconductor memory devices 200a~200k or read data from the semiconductor memory devices 200a~200k in response to requests from the host 20.

In addition, the memory controller 100 may issue operation commands to the semiconductor memory devices 200a~200k for controlling the semiconductor memory devices 200a~200k.

In some embodiments, each of the semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

Figure 2:
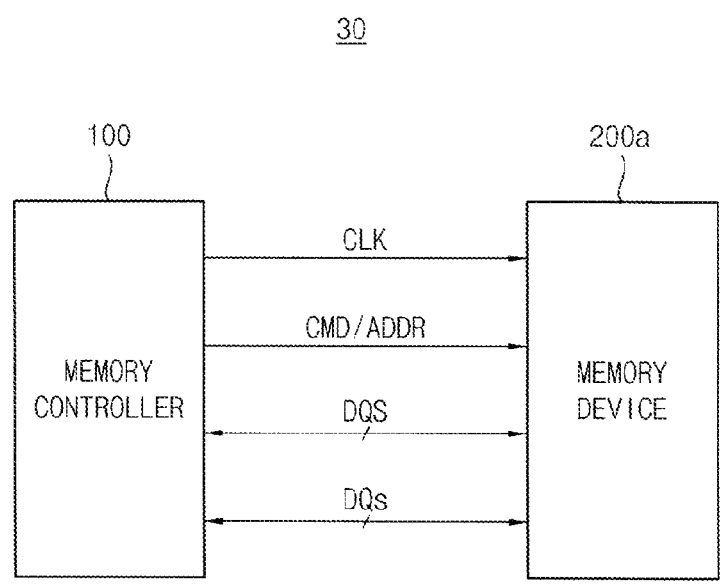
FIG. 2 is a block diagram illustrating an example of the memory system in FIG. 1 according to exemplary embodiments.

FIG. 2 is a block diagram illustrating an example of the memory system in FIG. 1 according to exemplary embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may include a stack of semiconductor chips in a semiconductor package). The memory controller 100 transmits to the semiconductor memory device 200a control signals such as a clock signal CLK, a command CMD, an address ADDR, data strobe signals DQS, and data DQs, and receives the data DQs and the data strobe signals DQS from the semiconductor memory device 200a.

The memory controller 100 may transmit a write command and/or a read command to the semiconductor memory device 200a. The semiconductor memory device 200a may perform a write operation in response to the write command and may perform a read operation in response to the read command.

Figure 3:
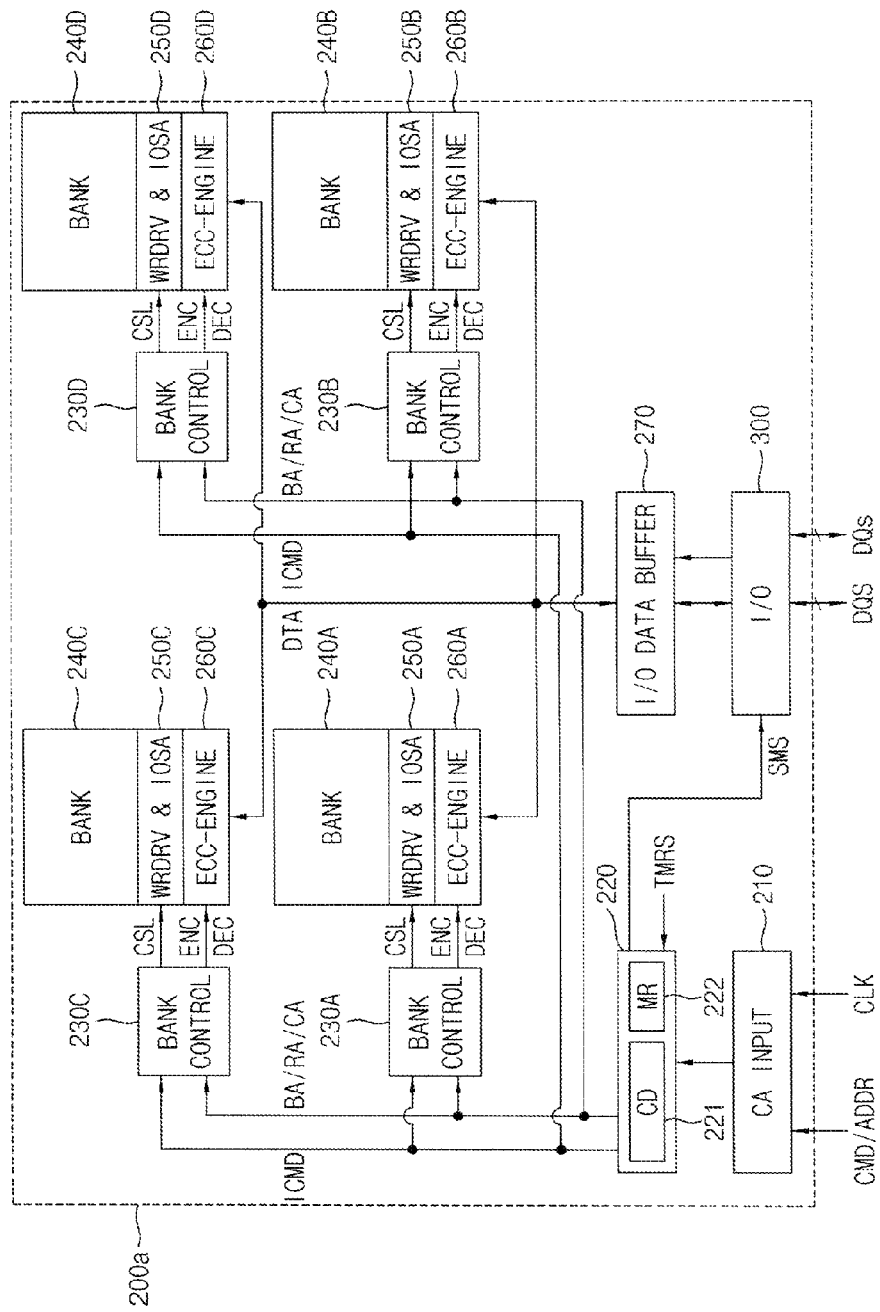
FIG. 3 is a block diagram illustrating an example of a semiconductor memory device of the memory system in FIG. 2 according to exemplary embodiments.

FIG. 3 is a block diagram illustrating an example of a semiconductor memory device of the memory system in FIG. 2 according to exemplary embodiments.

Referring to FIG. 3, the semiconductor memory device 200a may include a command/address input buffer 210, a control logic circuit 220, bank control logic 230A~230D, a memory cell array (of bank arrays) 240A~240D, write driver and data input/output (I/O) sense amplifiers 250A~250D, error correction code (ECC) engines 260A~260D, an I/O data buffer 270, and an I/O circuit 300.

The memory cell array (of bank arrays) 240A~240D may include first through fourth bank arrays 240A~240D, respectively, in which multiple memory cells are arrayed in rows and columns. A row decoder and a column decoder for selecting word-lines and bit-lines that are connected to the memory cells may be connected to each of the first through fourth bank arrays 240A~240D. In the exemplary embodiment, the semiconductor memory device 200a includes the four bank arrays 240A~240D, but in other embodiments, the semiconductor memory device 200a may include an arbitrary (i.e., different or varying) number of bank arrays.

The command/address input buffer 210 may receive a clock signal CLK, a command CMD, and an address ADDR from the memory controller 100 (not shown). The command CMD and the address ADDR may be input via the same terminals, i.e., CA pads. The command CMD and the address ADDR may be sequentially input via the CA pads. The command CMD issued by the memory controller 100 may include a read command and a write command. The read command indicates a read operation of/from the semiconductor memory device 200a. The write command indicates a write operation of/to the semiconductor memory device 200a.

The control logic circuit 220 may receive the command CMD and the address ADDR via the command/address input buffer 210, and may generate an internal command ICMD, a strobe mode signal SMS and an address signal (BA/RA/CA). The internal command ICMD may include an internal read command and an internal write command. The address signal may include a bank address BA, a row address RA, and a column address CA. The internal command ICMD and the address signal BA/RA/CA may be provided to each bank control logic 230A~230D. The control logic circuit 220 may control access to the memory cell array (of bank arrays) 240A~240D.

The control logic circuit 220 may include a command decoder 221 and a mode register 222. The command decoder 221 decodes the command CMD to generate the internal command ICMD and the mode register 222 may set an operation mode of the semiconductor memory device 200a based on the command CMD and the address ADDR. The mode register 222 may set a write latency in the write operation of the semiconductor memory device 200a and a read latency in the read operation of the semiconductor memory device 200a based on the command CMD and the address ADDR, according to a frequency of the clock signal CLK. Alternatively, the mode register 222 may set the write latency and read latency based on a test mode register set signal TMRS which is externally applied, according to a frequency of the clock signal CLK. The control logic circuit 222 may determine a logic level of the strobe mode signal SMS based on the write latency and the read latency and may provide the strobe mode signal SMS to the I/O circuit 300.

Each bank control logic 230A~230D may be activated while corresponding to the bank address BA. The activated bank control logic 230A~230D may generate bank control signals in response to the internal command ICMD, the row address RA, and the column address CA. In response to the bank control signal, the row decoder and the column decoder of each of the first through fourth bank arrays 240A~240D that are connected to the activated bank control logic 230A~230D may be activated.

The row decoder of each of the first through fourth bank arrays 240A~240D may decode the row address RA and therefore may enable a word-line that corresponds to the row address RA. The column address CA of each of the first through fourth bank arrays 240A~240D may be temporarily stored in a column address latch. The column address latch may stepwise increase the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signal, each bank control logic 230A~230D may generate an ECC encoding signal ENC and an ECC decoding signal DEC for controlling operations of the ECC engines 260A~260D that are connected to the first through fourth bank arrays 240A~240D, respectively.

The write driver and data I/O sense amplifiers 250A~250D may sense and amplify multiple pieces of read data output from the first through fourth bank arrays 240A~240D, respectively. The write driver and data I/O sense amplifiers 250A~250D may transmit multiple pieces of write data to be stored in the first through fourth bank arrays 240A~240D, respectively.

During the write operation, each of the ECC engines 260A~260D may generate parity bits by performing an ECC encoding operation on the pieces of write data to be stored in each of the first through fourth bank arrays 240A~240D, in response to the ECC encoding signal ENC output from each bank control logic 230A~230D.

During the read operation, each of the ECC engines 260A~260D may perform an ECC decoding operation in response to the ECC decoding signal DEC output from each of the first through fourth bank arrays 240A~240D. The ECC engines 260A~260D may perform the ECC decoding operation by using the pieces of data and parity bits that are read from each of the first through fourth bank arrays 240A~240D. Therefore, the ECC engines may detect and correct an error bit in the pieces of read data.

The I/O data buffer 270 may include circuits for gating multiple pieces of data that are input to or output from the first through fourth bank arrays 240A~240D; read data latches for storing the pieces of data output from the first through fourth bank arrays 240A~240D; and write data latches for writing the pieces of data to the first through fourth bank arrays 240A~240D.

The I/O data buffer 270 may convert parallel data bits that are output from the first through fourth bank arrays 240A~240D into serial data bits via the read data latches. The I/O data buffer 270 may convert multiple pieces of write data that are serially received into parallel data bits by using the write data latches.

The I/O circuit unit 300 may receive the serial data bits output from the I/O data buffer 270, may sequentially array the serial data bits as data bits that correspond to a burst length, and then may output together the data bits and the data strobe signal DQS to data I/O pads. The I/O circuit 300 may receive the data strobe signal DQS and the pieces of write data that correspond to the burst length and that are serially input via the data I/O pads from the memory controller 100. The I/O circuit unit 300 may provide, to the I/O data buffer 270, the pieces of serially input write data that correspond to the burst length.

The memory controller 100 in the memory system 20 may set a different data strobe mode of the semiconductor memory device 200a according to a frequency of the clock signal CLK.

For example, when the frequency of the clock signal CLK is greater than a reference frequency, the memory controller 100 may set the data strobe mode of the semiconductor memory device 200a to a first data strobe mode. In the first data strobe mode, the semiconductor memory device 200 may perform the write operation and the read operation on the memory cell array (of bank arrays) 240A~240D using differential data strobe signal pairs.

For example, when the frequency of the clock signal CLK is smaller than or equal to the reference frequency, the memory controller 100 may set the data strobe mode of the semiconductor memory device 200a to a second data strobe mode. In the second data strobe mode, the semiconductor memory device 200 may perform the write operation and the read operation on the memory cell array (of bank arrays) 240A~240D using single-ended data strobe signals. Therefore, a second number of data strobe signals associated with the write operation and the read operation in the second strobe mode is smaller than a first number of data strobe signals associated with the write operation and the read operation in the first data strobe mode. The memory system 20 therefore may reduce power consumption in the write operation and the read operation.

The table 1 below illustrates a write latency and read latency of the semiconductor memory device in the memory system 20 of FIG. 2 according to the frequency of the clock signal CLK.

TABLE 1

| READ LATENCY | WRITE LATENCY | LOWER CLOCK FREQUENCY LIMIT(Mbps) | HIGHER CLOCK FREQUENCY LIMIT(Mbps) |
|---|---|---|---|
| 6 | 4 | 100 | 266 |
| 10 | 6 | 266 | 533 |
| 14 | 8 | 533 | 800 |
| 20 | 10 | 800 | 1066 |
| 24 | 12 | 1066 | 1333 |
| 28 | 14 | 1333 | 1600 |
| 32 | 16 | 1600 | 1866 |
| 36 | 18 | 1866 | 2133 |

As is noted from the table 1, the read latency and the write latency of the semiconductor memory device 200a are defined in a specification of the semiconductor memory device 200a according to the frequency of the clock signal CLK. The memory controller 100 sets the read latency and the write latency of the semiconductor memory device 200a in the mode register 222 according to the frequency of the clock signal CLK. The mode register 222 may generate the strobe mode signal SMS in response to the frequency of the clock signal CLK. The read latency of the semiconductor memory device 200a indicates a clock cycle CLK delay between the read command and a first bit of valid output data. The write latency of the semiconductor memory device 200a indicates a clock cycle CLK delay between the write command and a first bit of valid write data.

Figure 4:
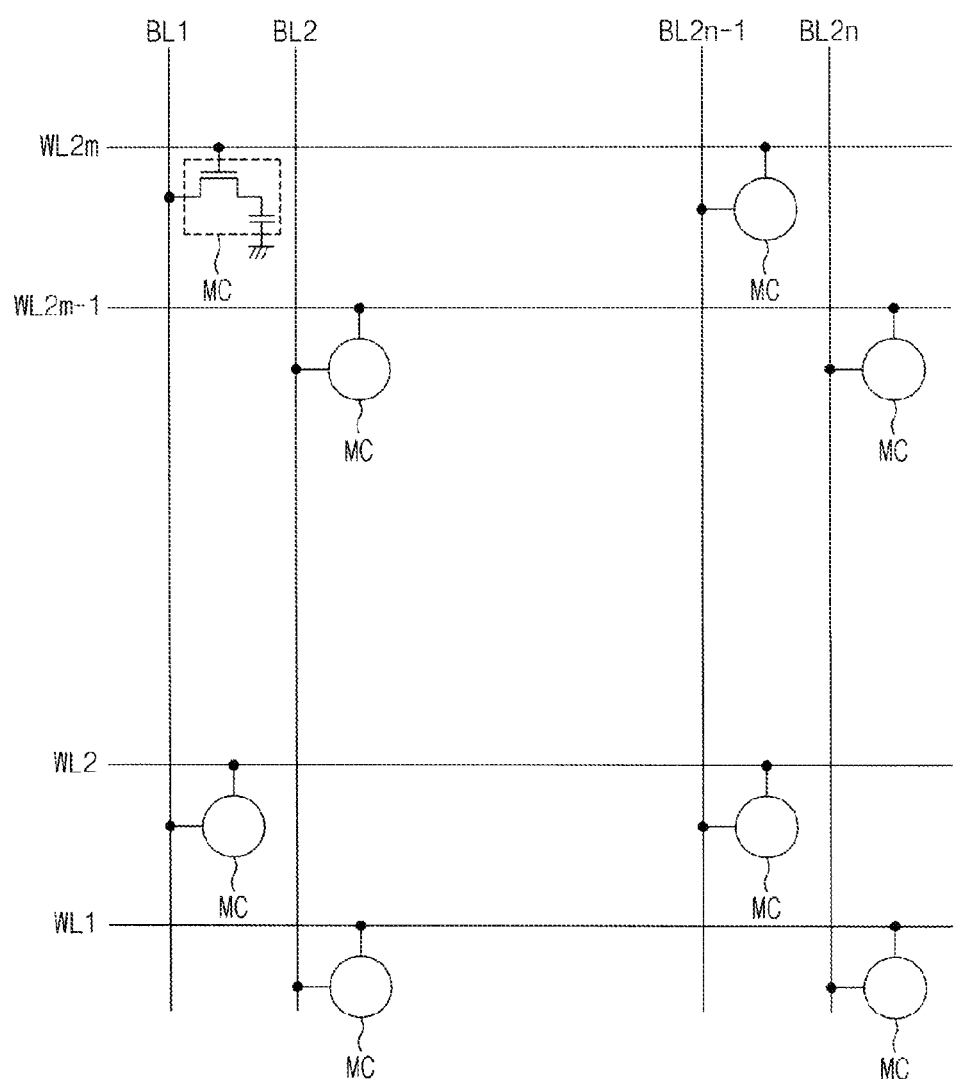
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 240A includes multiple word-lines WL1~WL2m (m is a natural number greater than two), multiple bit-lines BL1~BLn (n is a natural number greater than two), and multiple memory cells MCs disposed near intersections between the word-lines WL1~WL2m and the bit-lines BL1~BLn. In one embodiment, each of the memory cells MCs may include a dynamic random access memory (DRAM) cell structure. The word-lines WL1~WL2m to which the memory cells MCs are connected may be defined as rows of the first bank array 240A and the bit-lines BL1~BLn to which the memory cells MCs are connected may be defined as columns of the first bank array 240A.

In FIG. 4, m memory cells are coupled to a bit-line BL of the first bank array 310 and m memory cells are coupled to a word-line of the first bank array 310.

Figure 5:
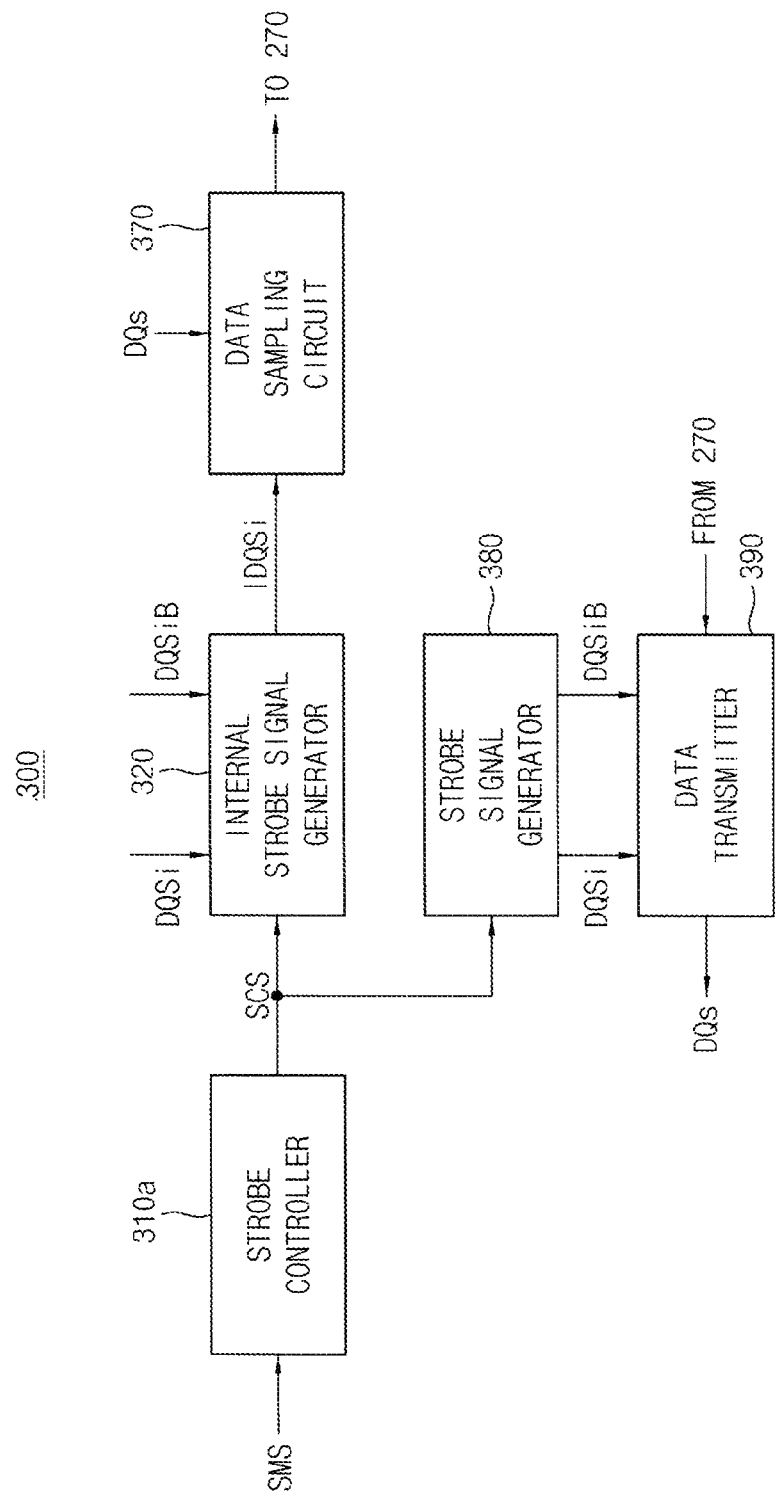
FIG. 5 illustrates an example of the I/O circuit in the semiconductor memory device of FIG. 3 according to exemplary embodiments.

FIG. 5 illustrates an example of the I/O circuit in the semiconductor memory device of FIG. 3 according to exemplary embodiments.

Referring to FIG. 5, the I/O circuit 300 may include a strobe controller 310a, an internal strobe signal generator 320, a data sampling circuit 370, an output strobe signal generator 380 and a data transmitter 390.

The strobe controller 310a may generate a strobe control signal SCS in response to the strobe mode signal SMS. The strobe controller 310a may also provide the strobe control signal SCS to the internal strobe signal generator 320 and the output strobe signal generator 380. The strobe control signal SCS may include one or more bits.

The internal strobe signal generator 320 generates internal strobe signals IDQSi based on one of differential data strobe signal pairs DQSi and DQSiB and single-ended data strobe signals DQSi which are selected from the differential strobe signal pairs DQSi and DQSiB, in response to the strobe control signal SCS. For example, the internal strobe signal generator 320, in the first data strobe mode, may generate the internal strobe signals IDQSi based on the differential data strobe signal pairs DQSi and DQSiB, in response to the strobe control signal SCS. For example, the internal strobe signal generator 320, in the second data strobe mode, may generate the internal strobe signals IDQSi based on the single-ended data strobe signals DQSi, in response to the strobe control signal SCS.

The data sampling circuit 370 may sample the data DQs based on the internal strobe signals IDQSi to provide the data DQs to the I/O data buffer 270, i.e. inside of the semiconductor memory device 200a.

The internal strobe signal generator 320 and the data sampling circuit 370 may be used in the write operation of the semiconductor memory device 200a.

The output strobe signal generator 380 may generate one of the differential data strobe signal pairs DQSi and DQSiB and the single-ended data strobe signals DQSi in response to the strobe control signal SCS. The output strobe signal generator 380 may provide the data transmitter 390 with one of the differential data strobe signal pairs DQSi and DQSiB and the single-ended data strobe signals DQSi. The data transmitter 390 may transmit the data DQs from the I/O data buffer 270 to the memory controller 100 in synchronization with one of the differential data strobe signal pairs DQSi and DQSiB and the single-ended data strobe signals DQSi.

For example, the output strobe signal generator 380, in the first data strobe mode, may generate the differential data strobe signal pairs DQSi and DQSiB in response to the strobe control signal SCS and, in the second data strobe mode, may generate the single-ended data strobe signals DQSi in response to the strobe control signal SCS.

The output strobe signal generator 380 and the data transmitter 390 may be used in the read operation of the semiconductor memory device 200a.

Figure 6:
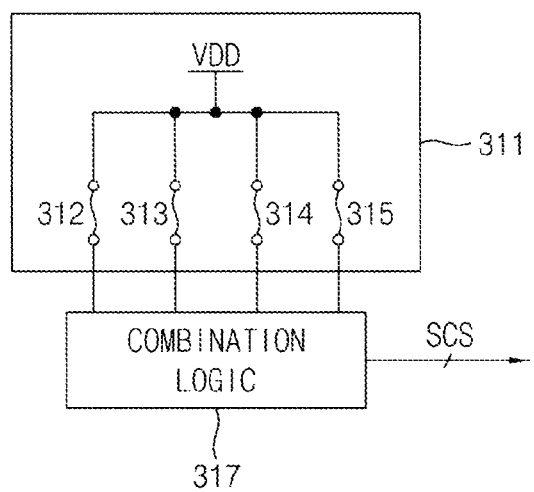
FIG. 6 illustrates an example of the strobe controller in the I/O circuit of FIG. 5 according to exemplary embodiments.

FIG. 6 illustrates an example of the strobe controller 310a in the I/O circuit of FIG. 5 according to exemplary embodiments.

Referring to FIG. 6, a strobe controller 310b may include a fuse circuit 311 and fuse signal combination logic 317.

The fuse circuit 311 includes multiple fuses 312~315. A power supply voltage VDD is applied to first ends of the fuses 312~315, and second ends of the fuses 312~315 are connected to the fuse signal combination logic 317. The power voltage VDD applied to the fuses 312~315 while the fuses 312~315 are connected to the fuse signal combination logic 317 is applied to the fuse signal combining unit 417. The power supply voltage VDD applied to the fuses 312~315 while the fuses 312~315 are not connected to the fuse signal combination logic 317 is not applied to the fuse signal combination logic 317.

The fuse signal combination logic 317 may output the strobe control signals SCS according to which of the fuses 312~315 are disconnected and connected to the fuse signal combination logic 317. For example, the fuse signal combination logic 317 outputs the strobe control signal SCS corresponding to the first data strobe mode when only the fuse 312 is disconnected and the remaining fuses 313~315 are connected. For example, the fuse signal combination logic 317 outputs the strobe control signal SCS corresponding to the second data strobe mode when the fuses 312 and 313 are disconnected and the remaining fuses 314 and 315 are connected.

The strobe controller 310b may generate the strobe control signal SCS in response to internally generated signals.

Figure 7:
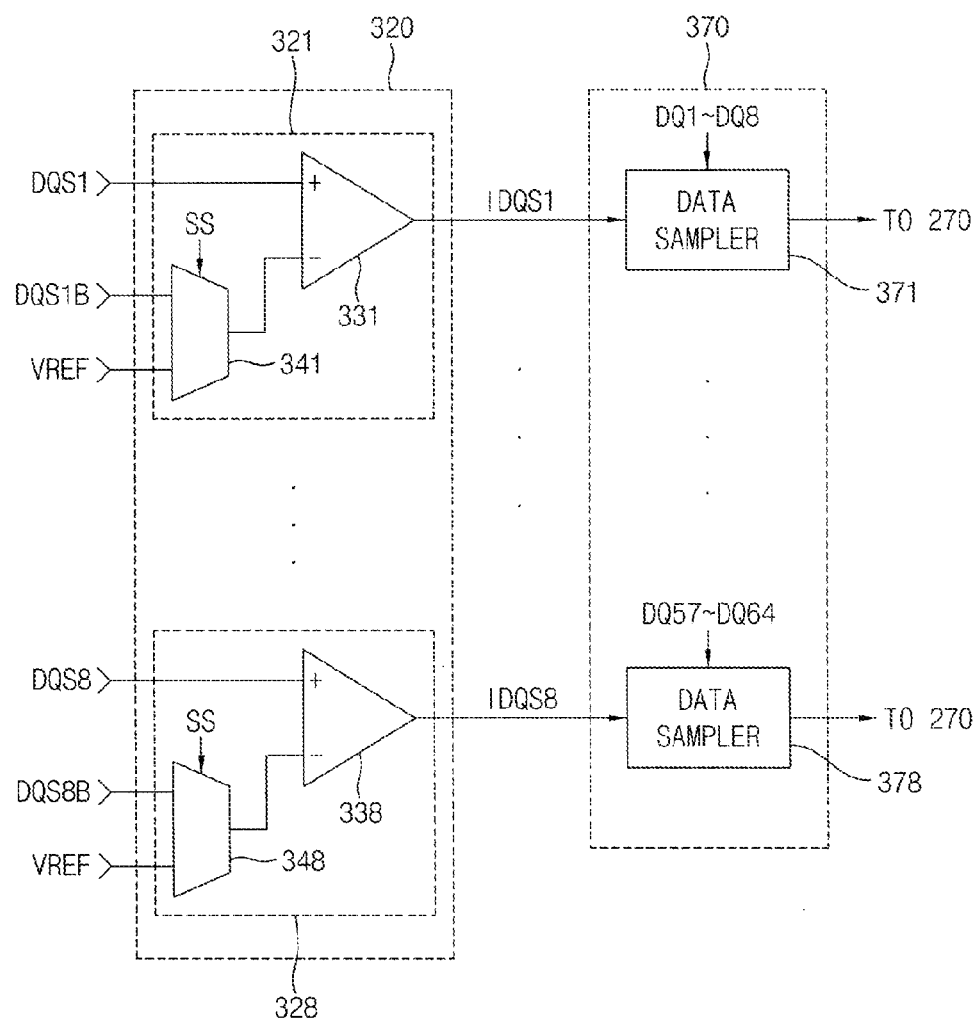
FIG. 7 illustrates the internal strobe signal generator and the data sampling circuit in the I/O circuit of FIG. 5.

FIG. 7 illustrates an example of the internal strobe signal generator 320 and the data sampling circuit 370 in the I/O circuit of FIG. 5.

In FIG. 7, it is assumed that i in FIG. 5 corresponds to 8. That is, there will be description on a case that the memory controller 100 and the semiconductor memory device 200a exchange 64-bit data DQs using 8 differential data strobe signal pairs or 8 single-ended data strobe signals.

Referring to FIG. 7, the internal strobe signal generator 320 includes multiple unit signal generators 321~328 and the data sampling circuit 370 includes multiple data samplers 371~378.

The unit signal generator 321 may include a comparator 331 and a multiplexer 341. The multiplexer 341 may select one of a first complementary data strobe signal DQS1B and a reference voltage VERF in response to a selection signal SS to output the selected one.

The selection signal SS may be included in the strobe control signal SCS. When the strobe mode signal SMS indicates the first data strobe mode, the multiplexer 341 may output the first complementary data strobe signal DQS1B in response to the selection signal SS. When the strobe mode signal SMS indicates the second data strobe mode, the multiplexer 341 may output the reference voltage VREF in response to the selection signal SS. The comparator 331 may compare a first true data strobe signal DQS1 and an output of the multiplexer 341 to output an internal strobe signal IDQS1 indicating a result of comparison of the first true data strobe signal DQS1 and the output of the multiplexer 341. Therefore, the comparator 331 may compare the first true data strobe signal DQS1 and the first complementary data strobe signal DQS1B to output the internal strobe signal IDQS1 in the first data strobe mode. The comparator 331 may compare the first true data strobe signal DQS1 and the reference voltage VREF to output the internal strobe signal IDQS1 in the second data strobe mode. In the second data strobe mode, the first true data strobe signal DQS1 may serve as a first single-ended data strobe signal.

The unit signal generator 328 may include a comparator 338 and a multiplexer 348. The multiplexer 348 may select one of eighth complementary data strobe signal DQS8B and the reference voltage VERF in response to the selection signal SS to output the selected one.

The comparator 338 may compare an eighth true data strobe signal DQS8 and an output of the multiplexer 348 to output an internal strobe signal IDQS8 indicating a result of comparison of the eighth true data strobe signal DQS8 and the output of the multiplexer 348. Therefore, the comparator 338 may compare the eighth true data strobe signal DQS8 and the eighth complementary data strobe signal DQS8B to output the internal strobe signal IDQS8 in the first data strobe mode. The comparator 331 may compare the first true data strobe signal DQS8 and the reference voltage VREF to output the internal strobe signal IDQS8 in the second data strobe mode. In the second data strobe mode, the eighth true data strobe signal DQS8 may serve as an eighth single-ended data strobe signal.

Configuration and operation of each of the remaining unit signal generators 322~327 are substantially the same as configuration and operation of each of the unit signal generators 321 and 328, and thus detailed description on the remaining unit signal generators 322~327 will be omitted.

The data sampler 371 samples data bits DQ1~DQ8 in synchronization with the first internal strobe signal IDQS1 to provide the sampled data bits to the I/O data buffer 270. The data sampler 378 samples data bits DQ57~DQ64 in synchronization with the eighth internal strobe signal IDQS6 to provide the sampled data bits to the I/O data buffer 270. Operation of each of the remaining data samplers (not illustrated) is substantially the same as operation of each of the data samplers 371 and 378, and thus detailed description on the remaining data samplers will be omitted.

Figure 8:
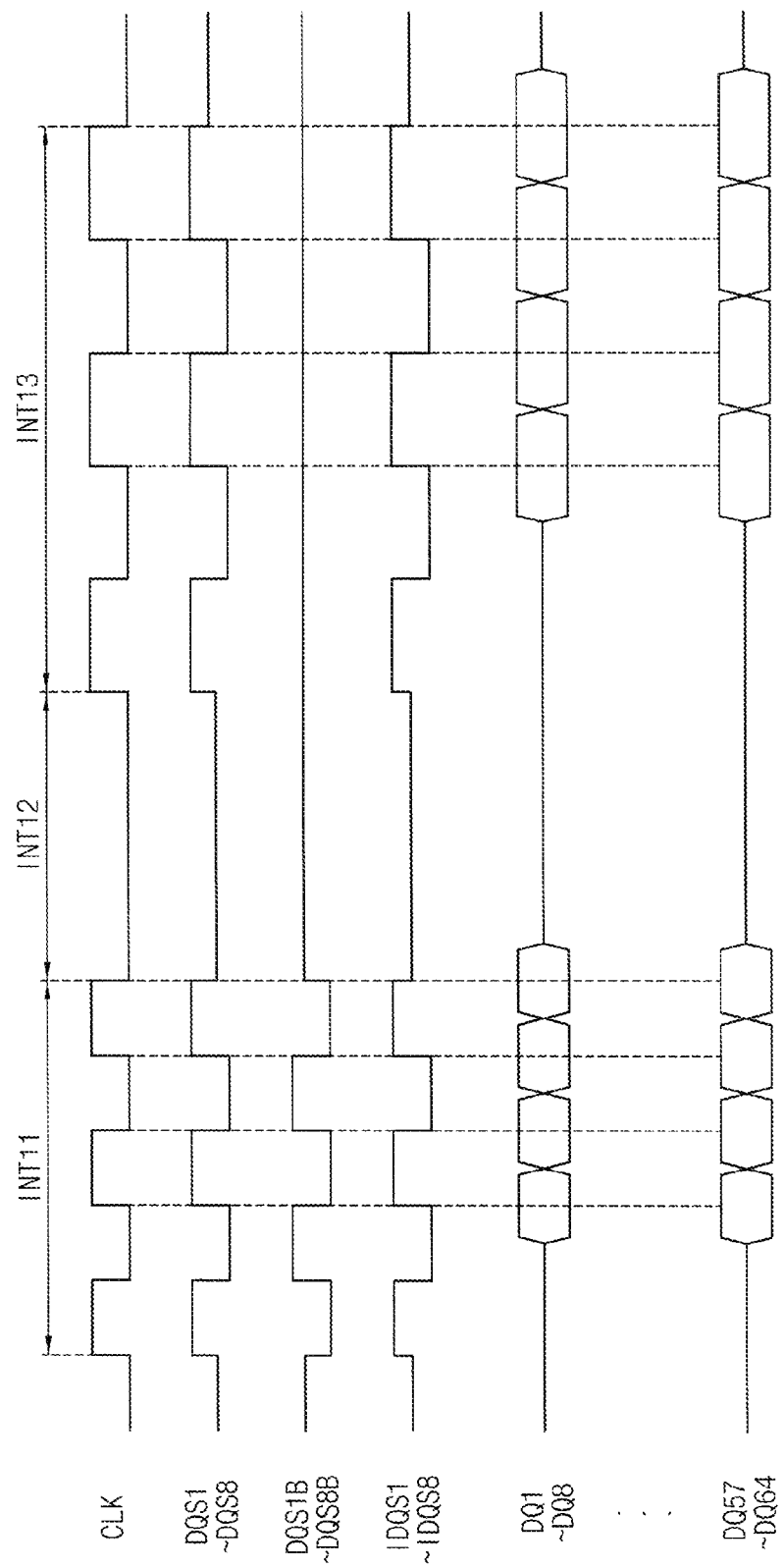
FIG. 8 is a timing diagram illustrating operation of the memory system of FIG. 2.

As is noted from FIG. 8, the memory system 30 of FIG. 2 may sample eight data bits using one differential data strobe signal pair in the first data strobe mode and may sample eight data bits using one single-ended data strobe signal in the second data strobe mode. When the memory controller 100 performs a write operation of 64-bit data DQs on the semiconductor memory device 200a, the memory system 30 uses 16 data strobe pins (or 8 differential data strobe signal pairs) in the first data strobe mode and uses 8 data strobe pins (or 8 single-ended data strobe signals) in the second data strobe mode. Therefore, power consumption in the second data strobe mode may be reduced than in the first data strobe mode.

FIG. 8 is a timing diagram illustrating operation of the memory system of FIG. 2.

Referring to FIGS. 2 through 8, during a first interval INT11 in which the memory system 30 operates in the first data strobe mode in which the frequency of the clock signal CLK is greater than the reference frequency, the internal strobe signal generator 320 generates the internal strobe signals IDQS1~IDQS8 using 8 differential data strobe signal pairs DQS1/DQS1B~DQS8/DQS8B. The data sampling circuit 370 samples the data bits DQ1~DQ64 in synchronization with the internal strobe signals IDQS1~IDQS8. That is, each of the data samplers 371~378 samples 8 data bits of data bits DQ1~DQ8, . . . , DQ57~DQ64 using each of 8 differential data strobe signal pairs DQS1/DQS1B~DQS8/DQS8B in the first data strobe mode.

When the memory controller 100 is to change a frequency of the clock signal CLK, the memory controller 100 halts toggling of the clock signal CLK. The differential data strobe signal pairs DQS1/DQS1B~DQS8/DQS8B do not toggle during a second interval INT12 in which the clock signal CLK does not toggle. During the second interval INT12, the memory controller 100 changes the data strobe mode of the memory system 30 from the first data strobe mode to the second data strobe mode by setting the mode register 221 to change the write latency and the read latency. The memory controller 100 changes the data strobe mode by the test mode register set signal TMRS or by changing configuration of the fuse circuit 311 in FIG. 6.

When changing of the data strobe mode of the memory system 30 is complete, the memory controller 100 provides the semiconductor memory device 200a with the clock signal CLK having a frequency smaller than or equal to the reference frequency.

During a third interval INT13 in which the memory system 30 operates in the second data strobe mode in which the frequency of the clock signal CLK is smaller than or equal to the reference frequency, the internal strobe signal generator 320 generates the internal strobe signals IDQS1~IDQS8 using 8 single-ended data strobe signals DQS1~DQS8. The data sampling circuit 370 samples the data bits DQ1~DQ64 in synchronization with the internal strobe signals IDQS1~IDQS8. That is, each of the data samplers 371~378 samples 8 data bits of data bits DQ1~DQ8, . . . , DQ57~DQ64 using each of 8 single-ended data strobe signals DQS1~DQS8 in the second data strobe mode.

Figure 9:
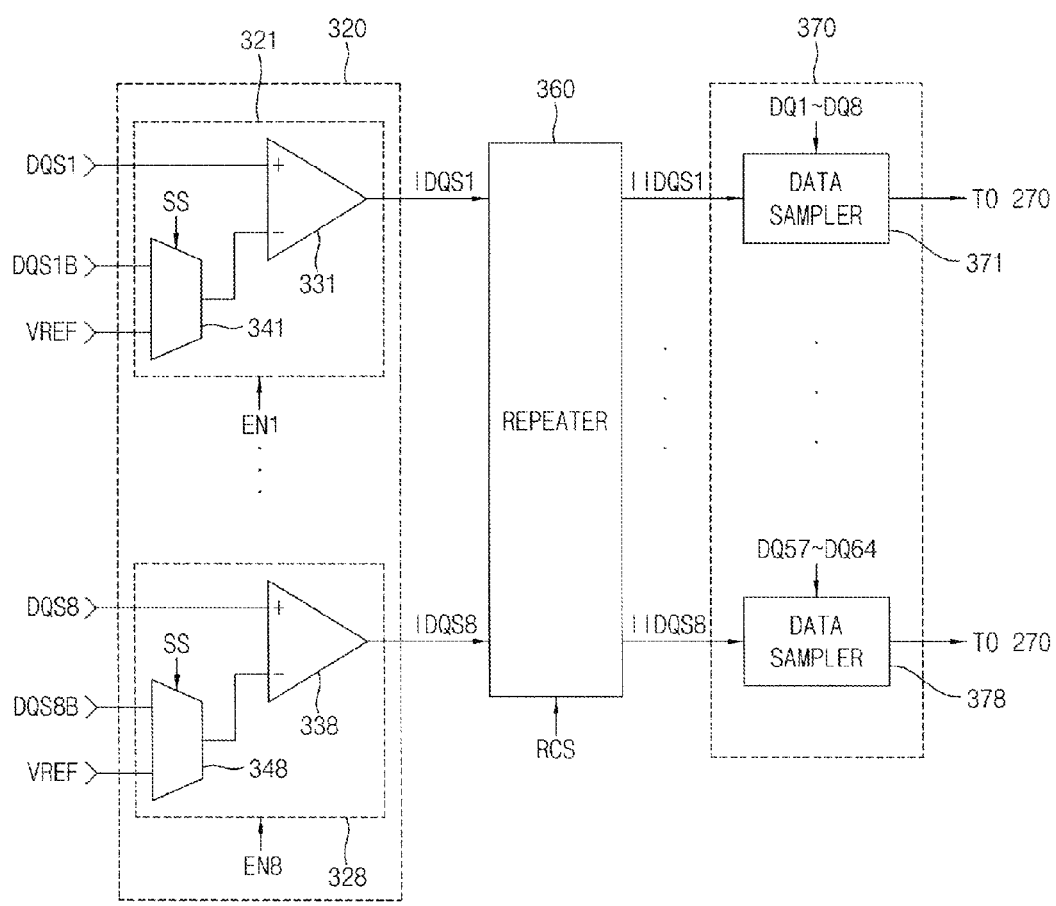
FIG. 9 illustrates a portion of the I/O circuit of FIG. 5 according to exemplary embodiments.

FIG. 9 illustrates a portion of the I/O circuit of FIG. 5 according to exemplary embodiments.

Referring to FIG. 9, the I/O circuit 300 of FIG. 5 may further include a repeater 360 connected between the internal strobe signal generator 320 and the data sampling circuit 370. When the I/O circuit 300 includes the repeater 360, each of enable signal EN1~EN8 may be applied to each of the unit signal generators 321~328. The enable signal EN1~EN8 may be included in the strobe control signal SCS.

When the strobe mode signal SMS indicates the first data strobe mode, as described with reference to FIG. 7, each of the multiplexers 341~348 selects each of the complementary data strobe signals DQS1B~DQS8B. Each of the comparators 331~338 compares each of the 8 differential data strobe signal pairs DQS1/DQS1B~DQS8/DQS8B to output each of first internal strobe signals IDQS1~IDQS8. The repeater 360 buffers the first internal strobe signals IDQS1~IDQS8 to provide second internal strobe signal IIDQS1~IIDQS8 to the data samplers 371~378. In the first data strobe mode, operation of the circuit of FIG. 7 is substantially the same as operation of the circuit of FIG. 9.

When the strobe mode signal SMS indicates that the frequency of the clock signal CLK is smaller than or equal to the reference frequency, the memory system 30 of FIG. 2 may operate in a second sub data strobe mode or in a third sub data strobe mode. In the second sub data strobe mode, the semiconductor memory device 200a may sample the data bits DQ1~DQ64 using a portion of 8 differential data strobe signal pairs DQS1/DQS1B~DQS8/DQS8B to reduce power consumption. In the third sub data strobe mode, the semiconductor memory device 200a may sample the data bits DQ1~DQ64 using a portion of 8 single-ended data strobe signals DQS1~DQS8 to reduce power consumption.

When the strobe mode signal SMS indicates the second sub data strobe mode, the enable signals EN1~EN4 of the enable signals EN1~EN4 are activated. The unit signal generators 321~324 are enabled in response to the enable signals EN1~EN4. Each of the multiplexers 341~344 selects each of the complementary data strobe signals DQS1B~DQS4B in response to the selection signal SS. Each of the comparators 331~334 compares each of the 4 differential data strobe signal pairs DQS1/DQS1B~DQS4/DQS4B to output each of the first internal strobe signals IDQS1~IDQS4. The repeater 360 buffers the first internal strobe signals IDQS1~IDQS4 to provide second internal strobe signal IIDQS1~IIDQS8 to each of the data samplers 371~378 in response to a repeater control signal RCS. The repeater control signal RCS may be included in the strobe control signal SCS.

That is, the first internal data strobe signal IDQS1 is repeated as the second internal data strobe signals IIDQS1 and IIDQS2. The first internal data strobe signal IDQS2 is repeated as the second internal data strobe signals IIDQS3 and IIDQS4. The first internal data strobe signal IDQS3 is repeated as the second internal data strobe signals IIDQS5 and IIDQS6. The first internal data strobe signal IDQS4 is repeated as the second internal data strobe signals IIDQS7 and IIDQS8. In the second sub data strobe mode, the semiconductor memory device 200a may sample the data bits DQ1~DQ64 using 4 differential data strobe signal pairs DQS1/DQS1B~DQS4/DQS4B to reduce power consumption. In the first data strobe mode 16 data strobe pins are used for write/read operation while in the second sub data strobe mode 8 data pins are used for write/read operation to/from reduce power consumption.

When the strobe mode signal SMS indicates the third sub data strobe mode, the enable signals EN1~EN4 of the enable signals EN1~EN4 are activated. The unit signal generators 321~324 are enabled in response to the enable signals EN1~EN4. Each of the multiplexers 341~344 selects the reference voltage VREF in response to the selection signal SS. Each of the comparators 331~334 compares each of the 4 single-ended data strobe signals DQS1~DQS4 with the reference voltage VREF to output each of the first internal strobe signals IDQS1~IDQS4. The repeater 360 buffers the first internal strobe signals IDQS1~IDQS4 to provide second internal strobe signal IIDQS1~IIDQS8 to each of the data samplers 371~378 in response to the repeater control signal RCS.

That is, the first internal data strobe signal IDQS1 is repeated as the second internal data strobe signals IIDQS1 and IIDQS2. The first internal data strobe signal IDQS2 is repeated as the second internal data strobe signals IIDQS3 and IIDQS4. The first internal data strobe signal IDQS3 is repeated as the second internal data strobe signals IIDQS5 and IIDQS6. The first internal data strobe signal IDQS4 is repeated as the second internal data strobe signals IIDQS7 and IIDQS8. In the third sub data strobe mode, the semiconductor memory device 200a may sample the data bits DQ1~DQ64 using 4 single-ended data strobe signal pairs DQS1~DQS4 to reduce power consumption. In the first data strobe mode 16 data strobe pins are used for a write/read operation, while in the second sub data strobe mode 4 data pins are used for a write/read operation to reduce power consumption.

The semiconductor memory device 200a, in the second sub data strobe mode or in the third sub data strobe mode, may perform sampling operation on data bits more than in the first data strobe mode, based on one differential data strobe signal pair or one single-ended data strobe signal.

The second sub data strobe mode or the third sub data strobe mode may be set by cutting one or more of the fuses 312~315 in the fuse circuit 311 in FIG. 6.

Figure 10:
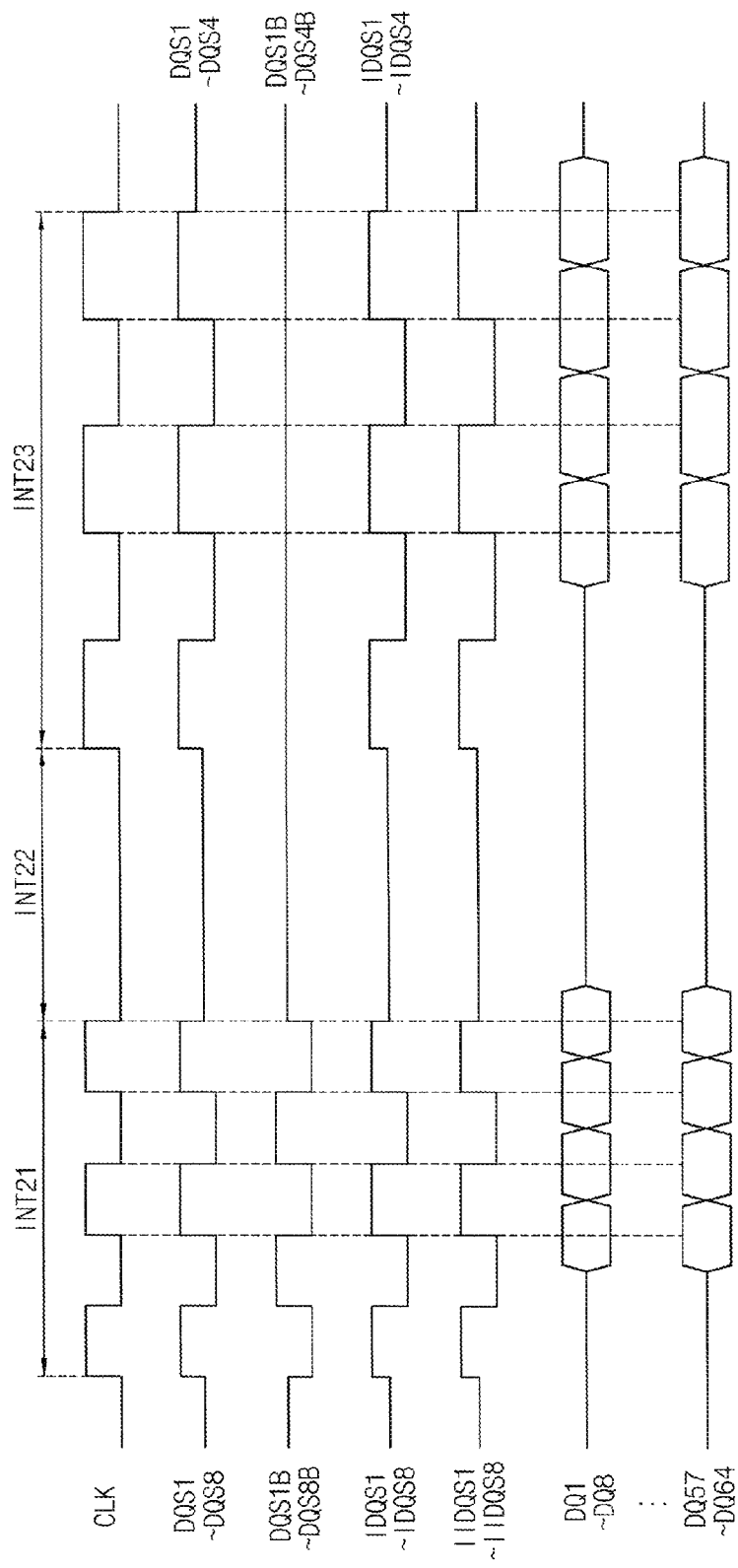
FIG. 10 is a timing diagram illustrating operation of the memory system of FIG. 2.

FIG. 10 is a timing diagram illustrating operation of the memory system of FIG. 2.

Referring to FIGS. 2 through 6, 9 and 10, during a first interval INT21 in which the memory system 30 operates in the first data strobe mode, the internal strobe signal generator 320 generates the first internal strobe signals IDQS1~IDQS8 using 8 differential data strobe signal pairs DQS1/DQS1B~DQS8/DQS8B. The repeater 360 generates the second internal strobe signals IIDQS1~IIDQS8 and the data sampling circuit 370 samples the data bits DQ1~DQ64 in synchronization with the second internal strobe signals IIDQS1~IIDQS8 as described with reference to FIG. 9. That is, each of the data samplers 371~378 samples 8 data bits of data bits DQ1~DQ8, . . . , DQ57~DQ64 using each of 8 differential data strobe signal pairs DQS1/DQS1B~DQS8/DQS8B in the first data strobe mode.

When the memory controller 100 is to change a frequency of the clock signal CLK, the memory controller 100 halts toggling of the clock signal CLK. The differential data strobe signal pairs DQS1/DQS1B~DQS8/DQS8B do not toggle during a second interval INT22 in which the clock signal CLK does not toggle. During the second interval INT22, the memory controller 100 changes the data strobe mode of the memory system 30 from the first data strobe mode to the second sub data strobe mode by setting the mode register 221 to change the write latency and the read latency. The memory controller 100 changes the data strobe mode by the test mode register set signal TMRS or by changing configuration of the fuse circuit 311 in FIG. 6.

When changing of the data strobe mode of the memory system 30 is complete, the memory controller 100 provides the semiconductor memory device 200a with the clock signal CLK having a frequency smaller than or equal to the reference frequency.

During a third interval INT23 in which the memory system 30 operates in the second sub data strobe mode in which the frequency of the clock signal CLK is smaller than or equal to the reference frequency, the internal strobe signal generator 320 generates the first internal strobe signals IDQS1~IDQS4 using 4 differential data strobe signal pairs DQS1/DQS1B~DQS4/DQS4B. The repeater 360 generates the second internal strobe signals IIDQS1~IIDQS8 and the data sampling circuit 370 samples the data bits DQ1~DQ64 in synchronization with the second internal strobe signals IIDQS1~IIDQS8 as described with reference to FIG. 9. That is, each of the data samplers 371~378 samples 16 data bits of data bits DQ1~DQ8, . . . , DQ57~DQ64 using each of 4 differential data strobe signal pairs DQS1/DQS1B~DQS4/DQS4B in the second sub data strobe mode.

Figure 11:
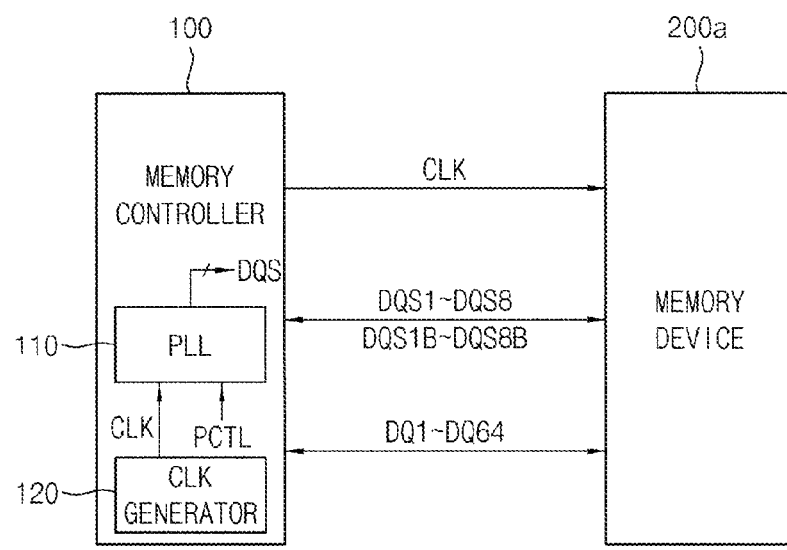
FIG. 11 illustrates the memory system of FIG. 2 in the first data strobe mode.

FIG. 11 illustrates the memory system of FIG. 2 in the first data strobe mode.

Referring to FIG. 11, as described with reference to FIG. 8, when the memory system 30 operates in the first data strobe mode in which the frequency of the clock signal CLK is greater than the reference frequency, the memory controller 100 and the semiconductor memory device 200a may exchange data bits DQ1~DQ64 using 8 differential data strobe signal pairs DQS1/DQS1B~DQS8/DQS8B. The memory controller 100 may include a clock generator 120 that generates the clock signal CLK and a phase-locked loop (PLL) circuit 110 that generates the data strobe signals DQS based on the clock signal CLK. The PLL circuit 110 may adjust a number of the strobe signals DQS in response to a control signal PCTL from a central processing unit (CPU) in the memory controller 100.

Figure 12:
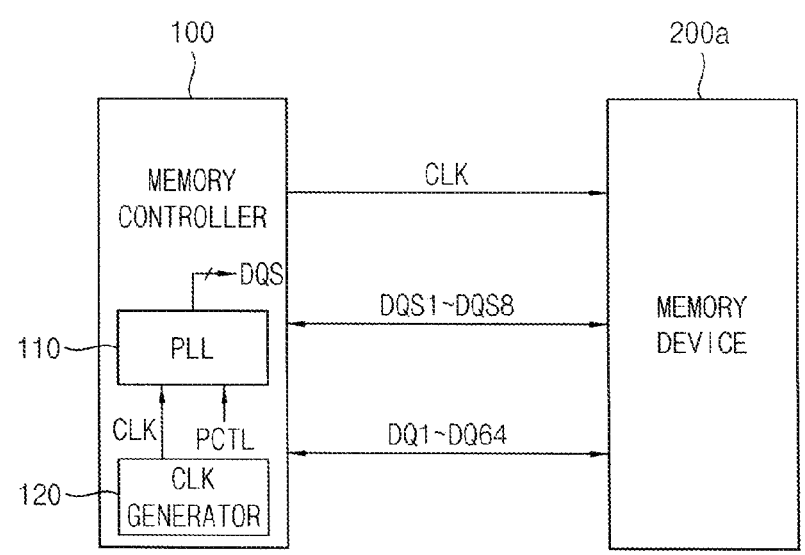
FIG. 12 illustrates the memory system of FIG. 2 in the second data strobe mode.

FIG. 12 illustrates the memory system of FIG. 2 in the second data strobe mode.

Referring to FIG. 12, as described with reference to FIG. 8, when the memory system 30 operates in the second data strobe mode in which the frequency of the clock signal CLK is smaller than or equal to the reference frequency, the memory controller 100 and the semiconductor memory device 200a may exchange data bits DQ1~DQ64 using 8 single-ended data strobe signals DQS1~DQS8. The PLL circuit 110 may generate the single-ended data strobe signals DQS1~DQS8 in response to the control signal PCTL from a CPU in the memory controller 100.

Figure 13:
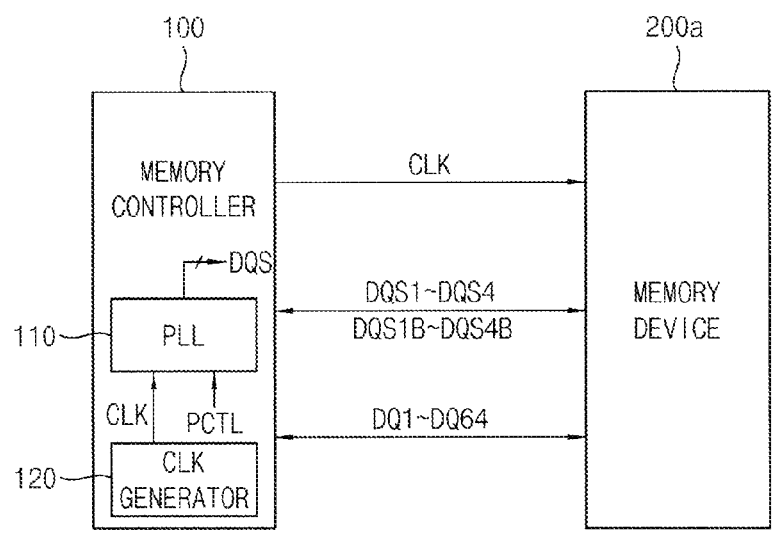
FIG. 13 illustrates the memory system of FIG. 2 in the second sub data strobe mode or in the third sub data strobe mode.

FIG. 13 illustrates the memory system of FIG. 2 in the second sub data strobe mode or in the third sub data strobe mode.

Referring to FIG. 13, as described with reference to FIGS. 9 and 10, when the memory system 30 operates in the second sub data strobe mode, the memory controller 100 and the semiconductor memory device 200a may exchange data bits DQ1~DQ64 using 4 differential data strobe signal pairs DQS1/DQS1B~DQS4/DQS4B. In addition, when the memory system 30 operates in the third sub data strobe mode, the memory controller 100 and the semiconductor memory device 200a may exchange data bits DQ1~DQ64 using 4 single-ended data strobe signals DQS1~DQS4. The PLL circuit 110 may generate the differential data strobe signal pairs DQS1/DQS1B~DQS4/DQS4B or the single-ended data strobe signals DQS1~DQS4 in response to the control signal PCTL from a CPU in the memory controller 100.

Figure 14:
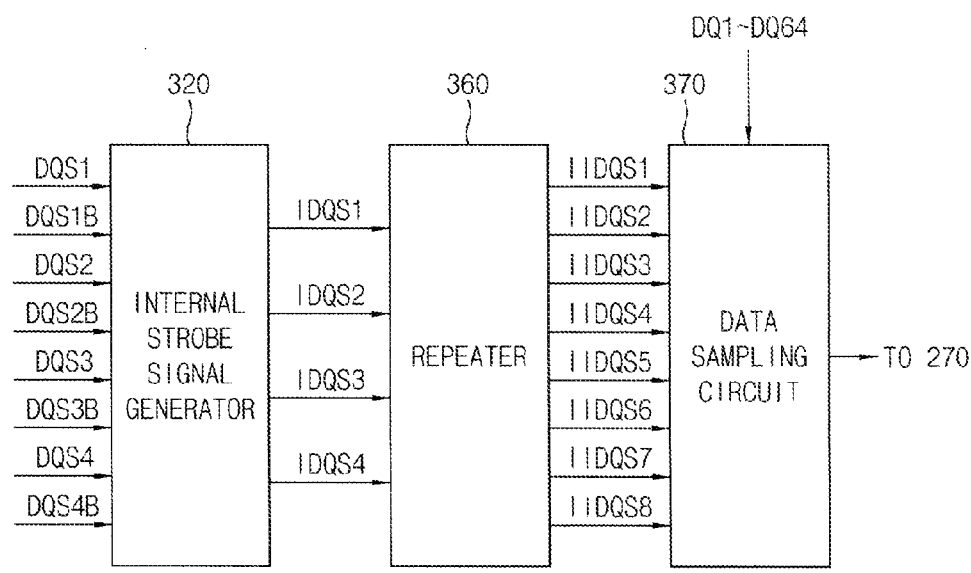
FIG. 14 illustrates operation of the I/O circuit of FIG. 9 in the second sub data strobe mode.

FIG. 14 illustrates operation of the I/O circuit of FIG. 9 in the second sub data strobe mode.

Referring to FIG. 14, when the strobe control signal SMS indicates the second sub data strobe mode, the internal strobe signal generator 320 generates 4 first internal strobe signals IDQS1~IDQS4 by comparing 4 differential data strobe signal pairs DQS1/DQS1B~DQS4/DQS4B. The repeater 360 generates 8 second internal strobe signals IIDQS1~IIDQS8 by repeating 4 first internal strobe signals IDQS1~IDQS4. That is, the first internal data strobe signal IDQS1 is repeated as the second internal data strobe signals IIDQS1 and IIDQS2. The first internal data strobe signal IDQS2 is repeated as the second internal data strobe signals IIDQS3 and IIDQS4. The first internal data strobe signal IDQS3 is repeated as the second internal data strobe signals IIDQS5 and IIDQS6. The first internal data strobe signal IDQS4 is repeated as the second internal data strobe signals IIDQS7 and IIDQS8. In the second sub data strobe mode, the semiconductor memory device 200a may use each of the 4 differential data strobe signal pairs DQS1/DQS1B~DQS4/DQS4B for sampling 16 data bits of the data bits DQ1~DQ64 to reduce power consumption.

As mentioned above, the memory system may reduce power consumption by reducing a second number of data strobe signals used when the frequency of the clock signal is smaller than or equal to the reference frequency compared to a first number of data strobe signals used when the frequency of the clock signal is greater than the reference frequency.

Figure 15:
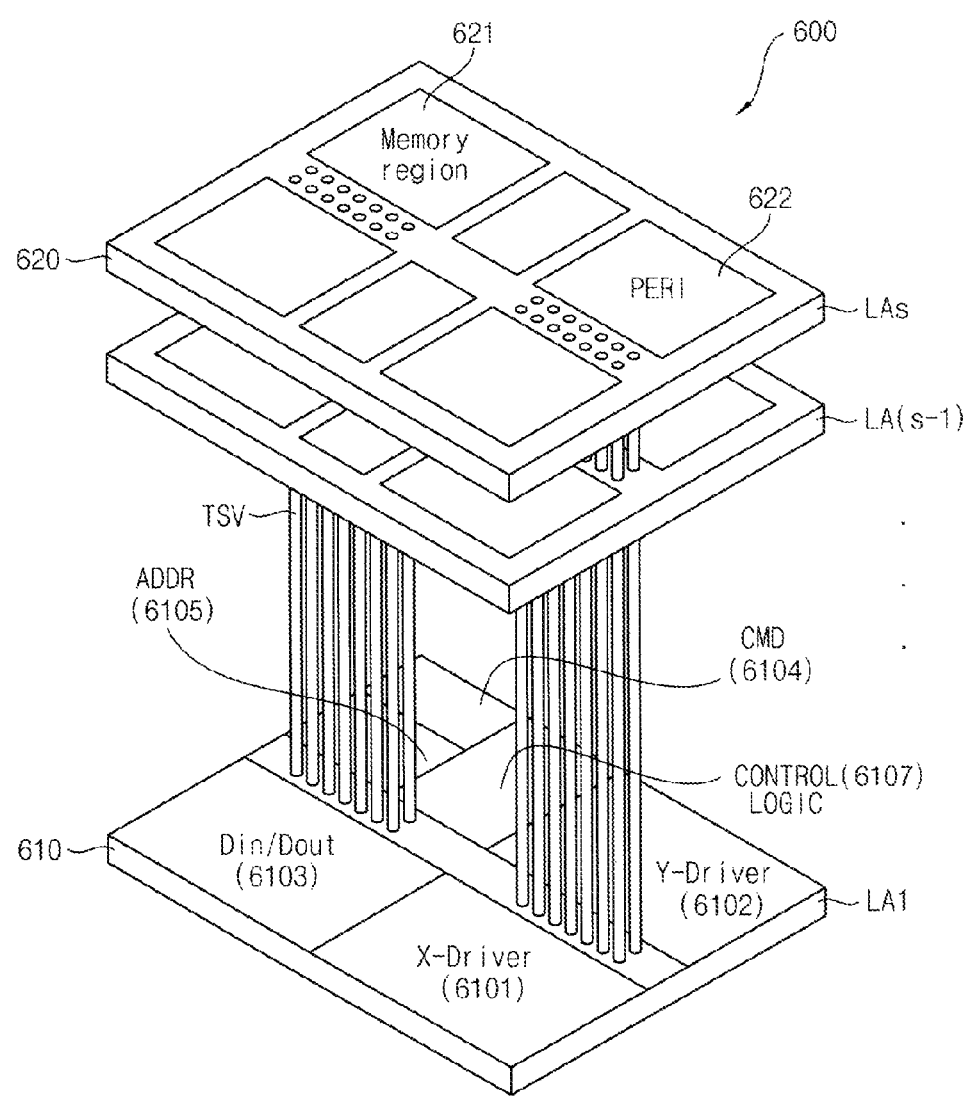
FIG. 15 is a structural diagram illustrating a semiconductor memory device according to exemplary embodiments.

FIG. 15 is a structural diagram illustrating a semiconductor memory device according to exemplary embodiments.

Referring to FIG. 15, a semiconductor memory device 600 may include first through sth semiconductor integrated circuit layers LA1 through LAs, in which the lowest first semiconductor integrated circuit layer LA1 is assumed to be an interface or control chip and the other semiconductor integrated circuit layers LA2 through LAs are assumed to be slave chips including core memory chips. The first through nth semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAs or 620 as the slave chip.

The first semiconductor integrated circuit layer 610 may include various peripheral circuits for driving a memory region 621 provided in the sth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data I/O circuit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. A memory region 621 may include multiple memory cells with reference to FIG. 4.

The first semiconductor integrated circuit layer 610 may further include a control logic 6107. The control logic 6107 may control an access to the memory region 621 based on a command and an address signal from a memory controller.

The sth semiconductor integrated circuit layer 620 may include the memory region 621 and peripheral circuit regions 622 in which peripheral circuits for reading/writing data of the memory region 621, e.g., a row decoder, a column decoder, a bit line sense amplifier, etc. (not illustrated) are arranged.

The data I/O circuit 6103 may employ the I/O circuit 300 of FIG. 5. Therefore, the semiconductor memory device 600 may reduce power consumption by reducing a second number of data strobe signals used when the frequency of the clock signal is smaller than or equal to the reference frequency compared to a first number of data strobe signals used when the frequency of the clock signal is greater than the reference frequency as described with reference to FIGS. 2 through 14.

In addition, a three-dimensional (3D) memory array is provided in semiconductor memory device 600. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as multiple levels, with word-lines and/or bit-lines shared between levels: U.S. Pat. Nos. 7,679,133; 8,553,466; 8,654,587; 8,559,235; and US Pat. Pub. No. 2011/0233648.

Figure 16:
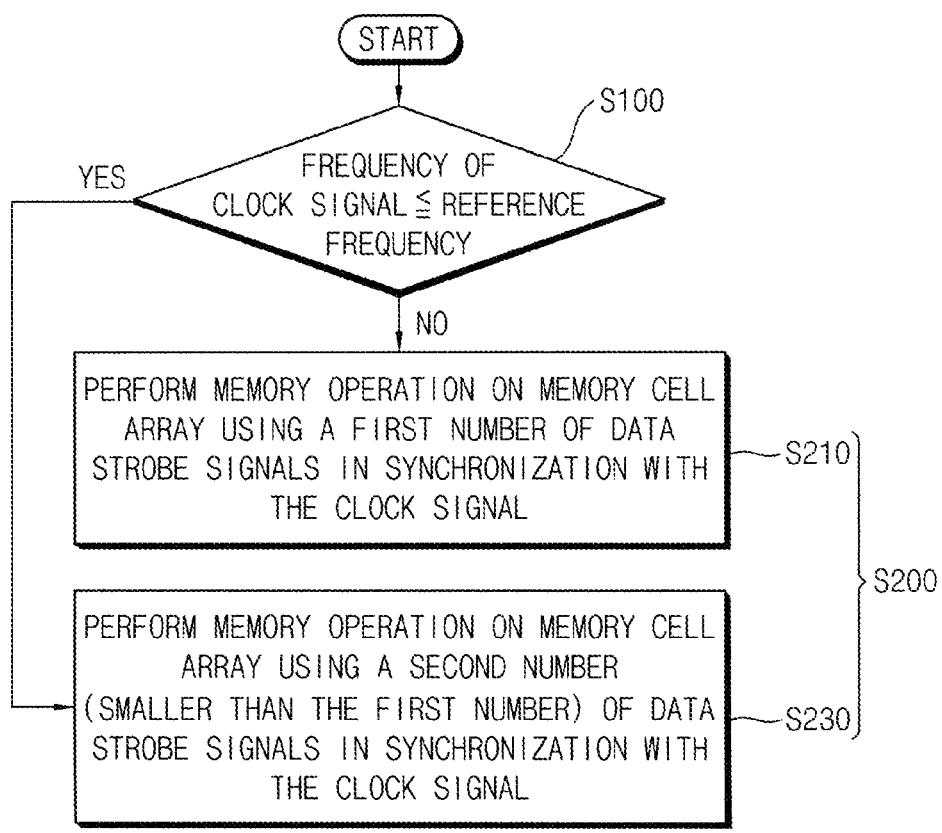
FIG. 16 is a flow chart illustrating a method of operating a semiconductor memory device according to exemplary embodiments.

FIG. 16 is a flow chart illustrating a method of operating a semiconductor memory device according to exemplary embodiments.

Referring to FIGS. 2 through 14 and 16, in a method of operating a semiconductor memory device that includes a memory cell array, it is determined whether a frequency of the clock signal CLK from a memory controller 100 is smaller than or equal to a reference frequency (S100). The semiconductor memory device 200a performs a memory operation on the memory cell array using a different number of data strobe signals according to the frequency of the clock signal (S200).

For example, when the frequency of the clock signal CLK is greater than the reference frequency (NO in S100), the semiconductor memory device 200a performs the memory operation on the memory cell array (of bank arrays) 240A~240D using differential data strobe signal pairs DQS1/DQS1B~DQS8/DQS8B as described above. When the frequency of the clock signal CLK is smaller than or equal to the reference frequency (YES in S100), the semiconductor memory device 200a performs the memory operation on the memory cell array (of bank arrays) 240A~240D using the differential data strobe signal pairs DQS1/DQS1B~DQS4/DQS4B or using single-ended data strobe signals DQS1~DQS4 as described above.

When the frequency of the clock signal CLK is greater than the reference frequency, the semiconductor memory device 200a performs the memory operation in synchronization with the clock signal CLK using a first number of data strobe signals (S210). When the frequency of the clock signal CLK is smaller than or equal to the reference frequency, the semiconductor memory device 200a performs the memory operation in synchronization with the clock signal CLK using a second number of data strobe signals (S230). The first number may be greater than the second number. The memory operation may include the write operation on the memory cell array (of bank arrays) 240A~240D and the read operation on the memory cell array (of bank arrays) 240A~240D.

Figure 17:
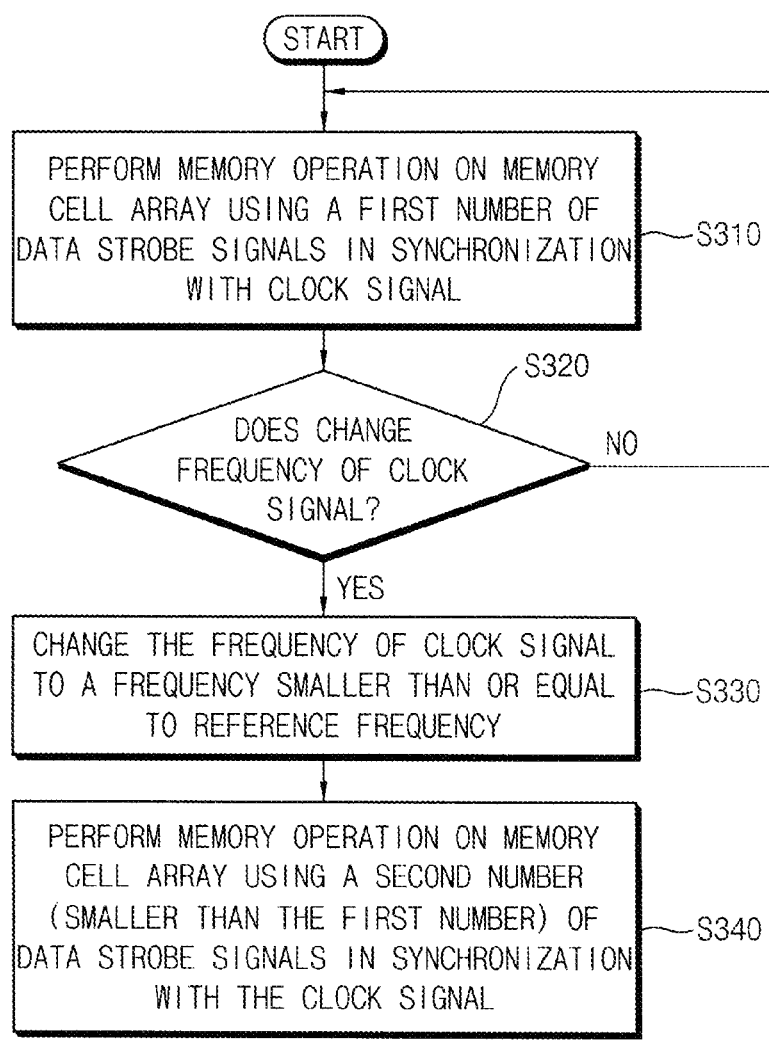
FIG. 17 is a flow chart illustrating a method of operating a semiconductor memory device according to exemplary embodiments.

FIG. 17 is a flow chart illustrating a method of operating a semiconductor memory device according to exemplary embodiments.

Referring to FIGS. 2 through 14 and 17, in a method of operating a semiconductor memory device that includes a memory cell array, the semiconductor memory device 200a performs a memory operation on the memory cell array (of bank arrays) 240A~240D in synchronization with the clock signal CLK using a first number of data strobe signals (S310). The semiconductor memory device 200a may perform the memory operation on the memory cell array (of bank arrays) 240A~240D using differential data strobe signal pairs DQS1/DQS1B~DQS8/DQS8B as described above.

It is determined whether to change the frequency of the clock signal (S320). When it is determined that the frequency of the clock signal CLK is not to be changed (NO in S320), the process returns to the step (S310). When it is determined that the frequency of the clock signal CLK is to be changed (YES in S320), the memory controller 100 changes the frequency of the clock signal CLK to have a frequency smaller than or equal to the reference frequency (S330). The semiconductor memory device 200a performs the memory operation on the memory cell array (of bank arrays) 240A~240D in synchronization with the clock signal CLK using a second number, which is smaller than the first number, of data strobe signals (S340). The semiconductor memory device 200a may perform the memory operation on the memory cell array (of bank arrays) 240A~240D using the single-ended data strobe signals DQS1~DQS8, the differential data strobe signal pairs DQS1/DQS1B~DQS4/DQS4B, or the single-ended data strobe signals DQS1~DQS4.

According to exemplary embodiments, the methods may reduce power consumption by reducing a second number of data strobe signals used when the frequency of the clock signal is smaller than or equal to the reference frequency compared to a first number of data strobe signals used when the frequency of the clock signal is greater than the reference frequency.

Figure 18:
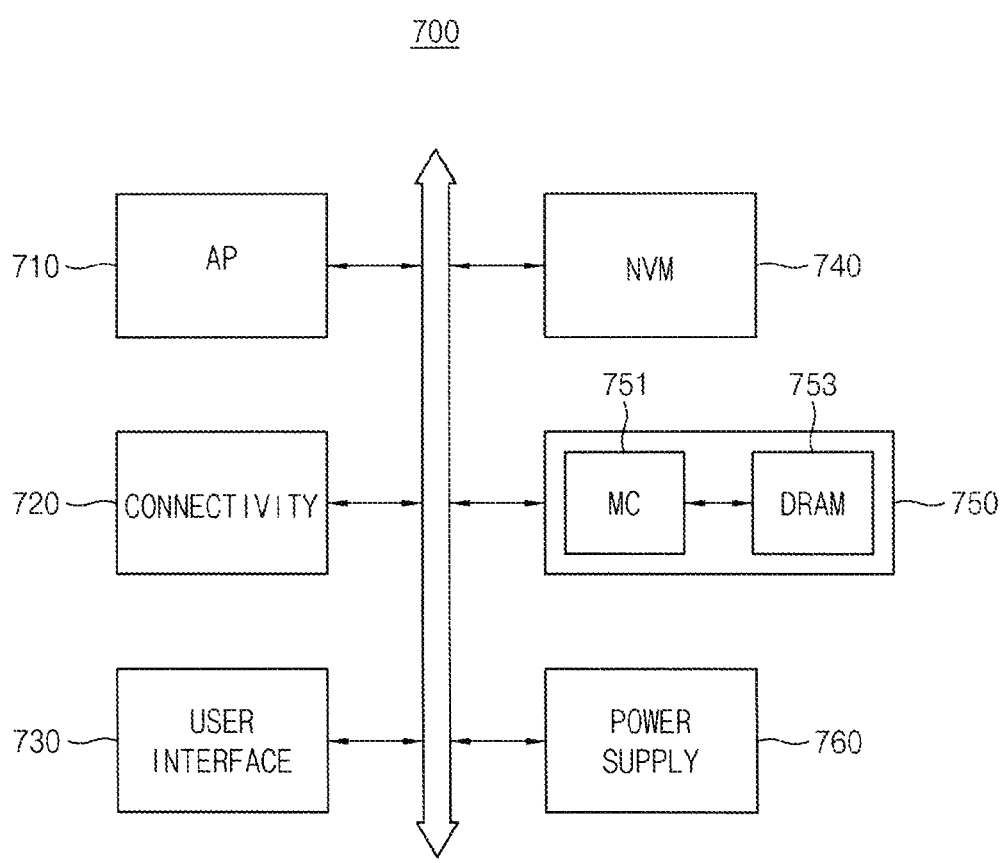
FIG. 18 is a block diagram illustrating a mobile system that includes the semiconductor memory device according to exemplary embodiments.

FIG. 18 is a block diagram illustrating a mobile system that includes the semiconductor memory device according to exemplary embodiments.

Referring to FIG. 18, a mobile system 700 may include an application processor 710, a connectivity unit 720, a user interface 730, a nonvolatile memory device 740, a memory sub system 750 and a power supply 760. The memory sub system 750 may include a memory controller 751 and a semiconductor memory device 750 such as DRAM.

The application processor 710 may execute applications, such as a web browser, a game application, a video player, etc. The connectivity unit 720 may perform wired or wireless communication with an external device.

The memory sub system 750 may store data processed by the application processor 710 or operate as a working memory. The memory sub system 750 may employ the memory system 30 of FIG. 2. Therefore, the memory sub system 750 may reduce power consumption by reducing a second number of data strobe signals used when the frequency of the clock signal is smaller than or equal to the reference frequency compared to a first number of data strobe signals used when the frequency of the clock signal is greater than the reference frequency.

The nonvolatile memory device 740 may store a boot image for booting the mobile system 700. The user interface 730 may include at least one input device, such as a keypad, a touch screen, etc., and at least one output device, such as a speaker, a display device, etc. The power supply 760 may supply a power supply voltage to the mobile system 700.

In some embodiments, the mobile system 700 and/or components of the mobile device 700 may be packaged in various forms.

The present disclosure may be applied to systems using semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:
1. A semiconductor memory device, comprising:
a memory cell array; and
a control logic circuit configured to control access to the memory cell array based on a command and an address,
wherein the semiconductor memory device is configured to perform a write operation to write data in the memory cell array and to perform a read operation to read data from the memory cell array in synchronization with a clock signal from an external memory controller, and
the semiconductor memory device is configured to perform the write operation and the read operation in different data strobe modes in which the semiconductor memory device uses different number of data strobe signals according to a frequency of the clock signal.

2. The semiconductor memory device of claim 1, wherein the semiconductor memory device is configured to perform operations comprising:
performing the write operation and the read operation in a first data strobe mode in which the semiconductor memory device uses differential data strobe signal pairs when the frequency of the clock signal is greater than a reference frequency; and
performing the write operation and the read operation in a second data strobe mode in which the semiconductor memory device uses single-ended data strobe signals when the frequency of the clock signal is smaller than or equal to the reference frequency.

3. The semiconductor memory device of claim 2, wherein a first total number of the data strobe signals in the first data strobe mode is greater than a second total number of the data strobe signals in the second data strobe mode.

4. The semiconductor memory device of claim 2, wherein the control logic circuit is configured to generate an internal command and a strobe mode signal based on the command, the address and the clock signal from the memory controller,
wherein the semiconductor memory device further includes an input/output circuit configured to generate internal strobe signals based on one of the differential data strobe signal pairs and the single-ended data strobe signals, and configured to output the data to the memory cell array based on the internal strobe signals,
wherein the internal command directs an operation of the semiconductor memory device, and
wherein the strobe mode signal determines the data strobe mode.

5. The semiconductor memory device of claim 4, wherein the input/output circuit comprises:
a strobe controller configured to generate a strobe control signal based on a strobe mode signal generated in response to the frequency of the clock signal or based on an internally-generated signal;
an internal strobe signal generator configured to generate the internal strobe signals based on one of the differential data strobe signal pairs and the single-ended data strobe signals according to the strobe control signal; and
a data sampling circuit configured to sample the data based on the internal strobe signals to provide the sampled data to inside of the semiconductor memory device.

6. The semiconductor memory device of claim 5, wherein the internal strobe signal generator includes a plurality of unit signal generators, and wherein each of the unit signal generators comprises:
a multiplexer configured to one of a complementary data strobe signal of the differential data strobe signal pair and a reference voltage, in response to a selection signal; and
a comparator configured to compare a true data strobe signal of the differential data strobe signal pair and an output of the multiplexer to output a corresponding internal strobe signal of the internal strobe signals.

7. The semiconductor memory device of claim 6, wherein the multiplexer is configured to select the complementary data strobe signal and the comparator is configured to compare the complementary data strobe signal and the true data strobe signal to output the corresponding internal strobe signal, in the first data strobe mode, and
wherein the multiplexer is configured to select the reference voltage and the comparator is configured to compare the reference voltage and the true data strobe signal to output the corresponding internal strobe signal, in the second data strobe mode.

8. The semiconductor memory device of claim 7, wherein the data sampling circuit includes a plurality of data samplers, each configured to sample a first unit of data based on one of the internal strobe signals.

9. The semiconductor memory device of claim 4, wherein the control logic circuit includes a mode register configured to generate the strobe mode signal by setting a read latency in the write operation and a read latency in the read operation based on the command, the address, the clock signal or based on a test mode register set signal.

10. The semiconductor memory device of claim 1, wherein the semiconductor memory device is configured to perform the write operation and the read operation by changing a number of data bits associated with one of a plurality of differential data strobe signal pairs or one of a plurality of single-ended data strobe signals according to the frequency of the clock signal.

11. The semiconductor memory device of claim 10, wherein the semiconductor memory device is configured to perform operations comprising:
performing the write operation and the read operation on a first number of data bits based on the one differential data strobe signal pair when the frequency of the clock signal is greater than a reference frequency; and
performing the write operation and the read operation on a second number of data bits based on the one single-ended data strobe signal when the frequency of the clock signal is smaller than or equal to than the reference frequency,
wherein the first number is smaller than the second number,
wherein the number of data bits are changed by setting a mode register in the semiconductor memory device based on the command and the address or based on a test mode register set signal or by cutting fuses in the semiconductor memory device,
wherein the memory cell array includes a plurality of dynamic memory cells, and
wherein the memory cell array is a three-dimensional memory cell array.

12. The semiconductor memory device of claim 10, further comprising:
an input/output circuit configured to generate second internal strobe signals based on a strobe mode signal or an internally-generated signal and configured to output the data to the memory cell array based on the second internal strobe signals,
wherein the strobe mode signal is generated based on the command, the address and the clock signal from the memory controller, and
wherein the input/output circuit comprises:
a strobe controller configured to generate a strobe control signal based on the strobe mode signal or the internally-generated signal;
an internal strobe signal generator configured to generate first internal strobe signals based on one of the differential data strobe signal pairs and the single-ended data strobe signals according to the strobe control signal;
a repeater configured to repeat the first internal strobe signals to provide the second internal strobe signals based on a repeater control signal; and a data sampling circuit configured to sample the data based on the second internal strobe signals to provide the sampled data to the memory cell array.

13. The semiconductor memory device of claim 12, wherein a number of the first internal strobe signals is smaller than a number of the second internal strobe signals when the frequency of the clock signal is smaller than the reference frequency.

14. A method of operating a semiconductor memory device that includes a memory cell array, the method comprising:
determining whether a frequency of a clock signal is smaller than or equal to a reference frequency, the clock signal being provided from an external memory controller; and
performing a memory operation on the memory cell array using different numbers of data strobe signals according to the frequency of the clock signal.

15. The method of claim 14, wherein the semiconductor memory device is configured to perform operations comprising:
performing the memory operation using a first number of data strobe signals when the frequency of the clock signal is greater than the reference frequency, and
performing the memory operation using a second number of data strobe signals when the frequency of the clock signal is smaller than or equal to the reference frequency,
wherein the memory operation includes a write operation to write data in the memory cell array and a read operation to read data from the memory cell array in synchronization with the clock signal, and
wherein the first number is greater than the second number.

16. A semiconductor memory device comprising:
a memory cell array; and
a control logic circuit configured to control access to the memory cell array,
wherein the semiconductor memory device is configured to perform a write operation to write data in the memory cell array and to perform a read operation to read data from the memory cell array in synchronization with a clock signal from an external memory controller, and
the semiconductor memory device is configured to perform the write operation and the read operation in different data strobe modes corresponding to differing power consumption according to a frequency of the clock signal.

17. The semiconductor memory device of claim 16,
wherein in a first data strobe mode, the write operation and the read operation are performed using differential data strobe signal pairs when the frequency of the clock signal is greater than a reference frequency; and
wherein in a second data strobe mode, the write operation and the read operation are performed using single-ended data strobe signals when the frequency of the clock signal is smaller than or equal to the reference frequency.

18. The semiconductor memory device of claim 17,
wherein the semiconductor memory device uses different numbers of data strobe signals corresponding to different power consumption in the different data strobe modes, and
wherein a first total number of the data strobe signals in the first data strobe mode is greater than a second total number of the data strobe signals in the second data strobe mode.

19. The semiconductor memory device of claim 17,
wherein the control logic circuit is configured to generate a strobe mode signal based on a command, an address and the clock signal from the memory controller, the strobe mode signal indicating one of the first data strobe mode and the second data strobe mode.

20. The semiconductor memory device of claim 17, further comprising:
a multiplexer configured to one of a complementary data strobe signal of one of the differential data strobe signal pairs and a reference voltage, in response to a selection signal; and
a comparator configured to compare a true data strobe signal of the differential data strobe signal pair and an output of the multiplexer,
wherein the multiplexer is configured to select the complementary data strobe signal and the comparator is configured to compare the complementary data strobe signal and the true data strobe signal, in the first data strobe mode, and
wherein the multiplexer is configured to select the reference voltage and the comparator is configured to compare the reference voltage and the true data strobe signal, in the second data strobe mode.

* * * * *